(12) United States Patent
Huber et al.

(10) Patent No.: US 7,366,032 B1
(45) Date of Patent: Apr. 29, 2008

(54) MULTI-PORTED REGISTER CELL WITH RANDOMLY ACCESSIBLE HISTORY

(75) Inventors: Jan-Michael Huber, Austin, TX (US); Michael Ciraula, Round Rock, TX (US); Jerry D. Moench, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 234 days.

(21) Appl. No.: 11/284,313

(22) Filed: Nov. 21, 2005

(51) Int. Cl.
  *G11C 7/10* (2006.01)
(52) U.S. Cl. .......................... 365/189.04; 365/189.03; 365/189.05; 365/189.08
(58) Field of Classification Search ............ 365/189.04, 365/189.03, 189.05, 189.08
See application file for complete search history.

(56) References Cited

U.S. PATENT DOCUMENTS

| | | | | |
|---|---|---|---|---|
| 4,660,177 A * | 4/1987 | O'Connor | ............ | 365/156 |
| 4,811,296 A * | 3/1989 | Garde | ............ | 365/189.02 |
| 4,817,051 A * | 3/1989 | Chang | ............ | 365/154 |
| 5,315,178 A * | 5/1994 | Snider | ............ | 326/44 |
| 5,477,489 A * | 12/1995 | Wiedmann | ............ | 365/189.04 |
| 5,481,495 A * | 1/1996 | Henkels et al. | ............ | 365/189.02 |
| 5,499,375 A * | 3/1996 | Miyaguchi | ............ | 712/2 |
| 5,574,935 A * | 11/1996 | Vidwans et al. | ............ | 712/23 |
| 5,579,273 A * | 11/1996 | Childers et al. | ............ | 365/205 |
| 5,590,087 A * | 12/1996 | Chung et al. | ............ | 365/230.05 |
| 5,644,780 A * | 7/1997 | Luick | ............ | 712/23 |
| 5,657,291 A * | 8/1997 | Podlesny et al. | ............ | 365/230.05 |
| 5,671,187 A * | 9/1997 | Childers et al. | ............ | 365/205 |
| 5,777,928 A * | 7/1998 | Vidwans et al. | ............ | 365/189.05 |
| 5,813,037 A * | 9/1998 | Martell et al. | ............ | 711/147 |
| 5,923,608 A * | 7/1999 | Payne | ............ | 365/230.05 |
| 5,978,907 A | 11/1999 | Tran | | |
| 6,002,880 A * | 12/1999 | Slavenburg | ............ | 712/24 |
| 6,104,642 A * | 8/2000 | Blomgren et al. | ............ | 365/189.02 |
| 6,307,793 B1 * | 10/2001 | Murakami | ............ | 365/189.11 |
| 6,343,348 B1 * | 1/2002 | Tremblay et al. | ............ | 711/149 |
| 6,370,623 B1 * | 4/2002 | Mehra et al. | ............ | 711/149 |
| 6,378,065 B1 * | 4/2002 | Arnold et al. | ............ | 712/228 |
| 6,430,083 B1 * | 8/2002 | Lu et al. | ............ | 365/154 |
| 6,834,024 B2 | 12/2004 | Frydel | | |
| 6,839,830 B2 | 1/2005 | Liu | | |
| 7,085,966 B2 * | 8/2006 | Luick | ............ | 714/43 |
| 7,117,342 B2 * | 10/2006 | Tremblay et al. | ............ | 712/208 |
| 7,221,607 B1 * | 5/2007 | Vernenker et al. | ............ | 365/210 |

* cited by examiner

*Primary Examiner*—Viet Q. Nguyen
(74) *Attorney, Agent, or Firm*—Meyertons Hood Kivlin Kowert & Goetzrl, P.C.; Erik A. Heter

(57) ABSTRACT

A multi-ported register cell. The register cell includes a base cell and a plurality of history cells, each of which is coupled to the base cell. Each of the plurality history cells is coupled to write to the base cell through a first port, and each of the plurality of history cells is coupled to receive data from the base cell through a second port.

24 Claims, 4 Drawing Sheets

MULTI-PORTED REGISTER CELL WITH RANDOMLY ACCESSIBLE HISTORY

BACKGROUND OF THE INVENTION

1. Field of the Invention

This invention relates to computer systems, and more particularly, to register cells.

2. Description of the Related Art

Multi-ported register files are well known. These types of register files typically include a plurality of read ports and a plurality of write ports to allow multiple concurrent reads and/or writes. Multi-ported register files include main cells and history cells. The main cells store the active state of the register file, while the history cells store contents that were previously stored in the main cells. Multi-ported register files such as this are typically used in applications where it may be necessary to recover a previous state of the main cells from the history cells (e.g., in processors configured for speculative execution).

In various implementations, the history cells of a multi-ported register file are constructed by coupling a plurality of history cells to a main cell. This method of constructing multi-ported register files configured to store a history can be very inefficient. Coupling a number of history cells to a main cell can lead to problems such as leakage and bi-polar effect. The problems of leakage currents and bi-polar effects may become more severe as more history cells are added. Furthermore, reading and/or writing to the history cells may require a number of cycles of the multi-ported register file. Various methods may be used to combat the problems of leakage currents and bi-polar effects, as well as reducing the amount of time necessary to read and/or write to the history cells. However, many such solutions require extra circuitry, causing the multi-ported register file to become less area-efficient.

SUMMARY OF THE INVENTION

A multi-ported register cell is disclosed. In one embodiment, the register cell includes a base cell and a plurality of history cells, each of which is coupled to the base cell. Each of the plurality history cells is coupled to write to the base cell through a first port, and each of the plurality of history cells is coupled to receive data from the base cell through a second port.

In one embodiment, the multi-ported register cell further includes a shift cell, wherein the shift cell is coupled between the plurality of history cells and the base cell. Each of the history cells is configured to write directly to the base cell. The base cell is configured to write to the history cells via the shift cell.

In one embodiment, the base cell is configured to store a current state of the register cell while the history cells store previous states of the register cell. If it is necessary to recover a previous state, a pointer signal is provided to one of the plurality of history cells and a backup signal is provided to the base cell. The data value stored in the history cell is then allowed to propagate to the base cell as a data signal and a complementary data signal (only one of which is actually driven to the base cell). If it is necessary for the base cell to write to the history cell, the targeted history cell receives both the pointer signal and write enable signal. The base cell first writes to the shift cell, and, after a delay of one or more cycles, the shift cell writes the data into the history cell.

The register cell includes a plurality of read ports and a plurality of write ports. The read ports allow access to the base cell for circuitry external to the register file to read the base cell. The write ports allow access to the base cell for circuitry external to the register file to perform writes to the base cell.

A register file is also contemplated. The register file includes a plurality of the multi-ported register cells. The multi-ported register cells are grouped together to form registers, including a set of base register and a set of history registers. The register file may be useful in applications where it is necessary to store a current register state and a plurality of previous register states.

BRIEF DESCRIPTION OF THE DRAWINGS

Other aspects of the invention will become apparent upon reading the following detailed description and upon reference to the accompanying drawings in which.

Figure 1:
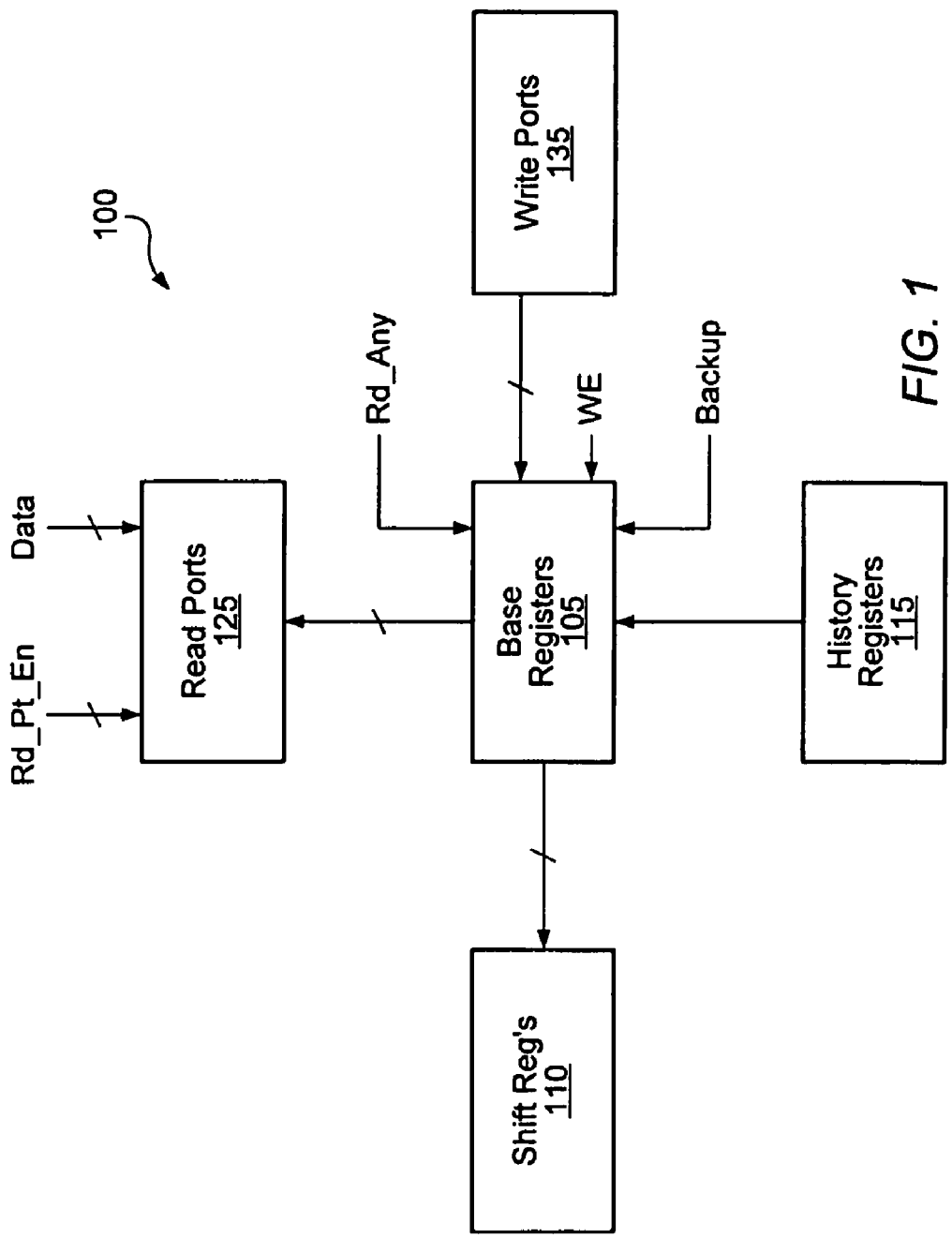
FIG. 1 is a block diagram of one embodiment of a multi-ported register file.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a block diagram of one embodiment of a multi-ported register file is shown. Register file 100 may be used in various types of applications where it is necessary to store a current register state and several previous states. Such applications include microprocessors that use register renaming and thus are required to store a map associating logical register names with physical register names and similar applications wherein the storage of a recoverable history is required.

In the embodiment shown, multi-ported register file 100 (hereinafter 'register file 100') includes a set of base registers 105. The base registers 105 may be read from through a plurality of read ports 125 (shown here as a single block for the sake of simplicity) and written to through a plurality of write ports (also shown as a single block). Data may be read from base registers 105 upon one of the read ports receiving a read enable signal from circuitry external to register file 100. Similarly, data may be written to base registers 105 when base registers 105 receive a write enable signal (WE) from circuitry external to register file 100. The particular port that reads or writes to base registers 105 is determined by one of a plurality of read port enable (RD PT EN) signals or write port enable signals (WT PT EN) received by one of read ports 125 or write ports 135, respectively.

Base registers 105 are coupled to a plurality of history registers 115. Register file 100 is configured to store a current register state in base registers 105, and is further configured to store a plurality of previously stored register states in history registers 115. Each of history registers 115 is coupled to receive a pointer signal (POINTER) that is used to select the appropriate history registers for read and write operations. If it is necessary to restore a previously stored state of register file 100 from history registers 115 to base registers 105, a backup signal, BACKUP, is provide to base registers 105 while the pointer signal is provided to an appropriate set of history registers 115. Data from the selected history registers 115 is then conveyed to base register 105, thereby recovering a previously stored state of register file 100. This operation may occur in a single cycle, allowing a fast restoring of a previous register state into base register 105.

When it is necessary to write a register state from base registers 105 to history registers 115, data is first written from base registers 105 to shift registers 110. This may occur when shift registers 110 receive a shift enable signal and base cell 105 receives the read enable signal AnyRD_A. The shift enable signal received by shift registers 110 allow data stored in base registers 105 to propagate into shift registers 110. Shift registers 110 in essence form a small pipeline and therefore effectively provide storage of extra register states in register file 100. The data received by shift registers 110 is temporarily held until another shift enable signal is received, after which the data in shift registers 110 either propagates to another location in shift registers 110 or propagates to a location in history registers 115 indicated by the pointer signal. The number of extra register states that may be effectively stored by register file 100 is based on the number of stages of the pipeline. For example, one embodiment to be discussed below includes two stages in the pipeline as well as sixteen history cells, and thus a register file built with such circuitry would effectively store eighteen previous register states.

History registers 115 are each coupled to receive a write enable signal in order to allow them to be written to when selected by the pointer signal. After data has reached the output stage of the pipeline formed by shift registers 110 it is then allowed to propagate to a set of history registers selected by the pointer after the history registers 115 receive a write enable signal (WRITE). Thus, in order to write to a set of history registers 115, both a write enable signal and a pointer signal is asserted for the targeted history registers.

Figure 2:
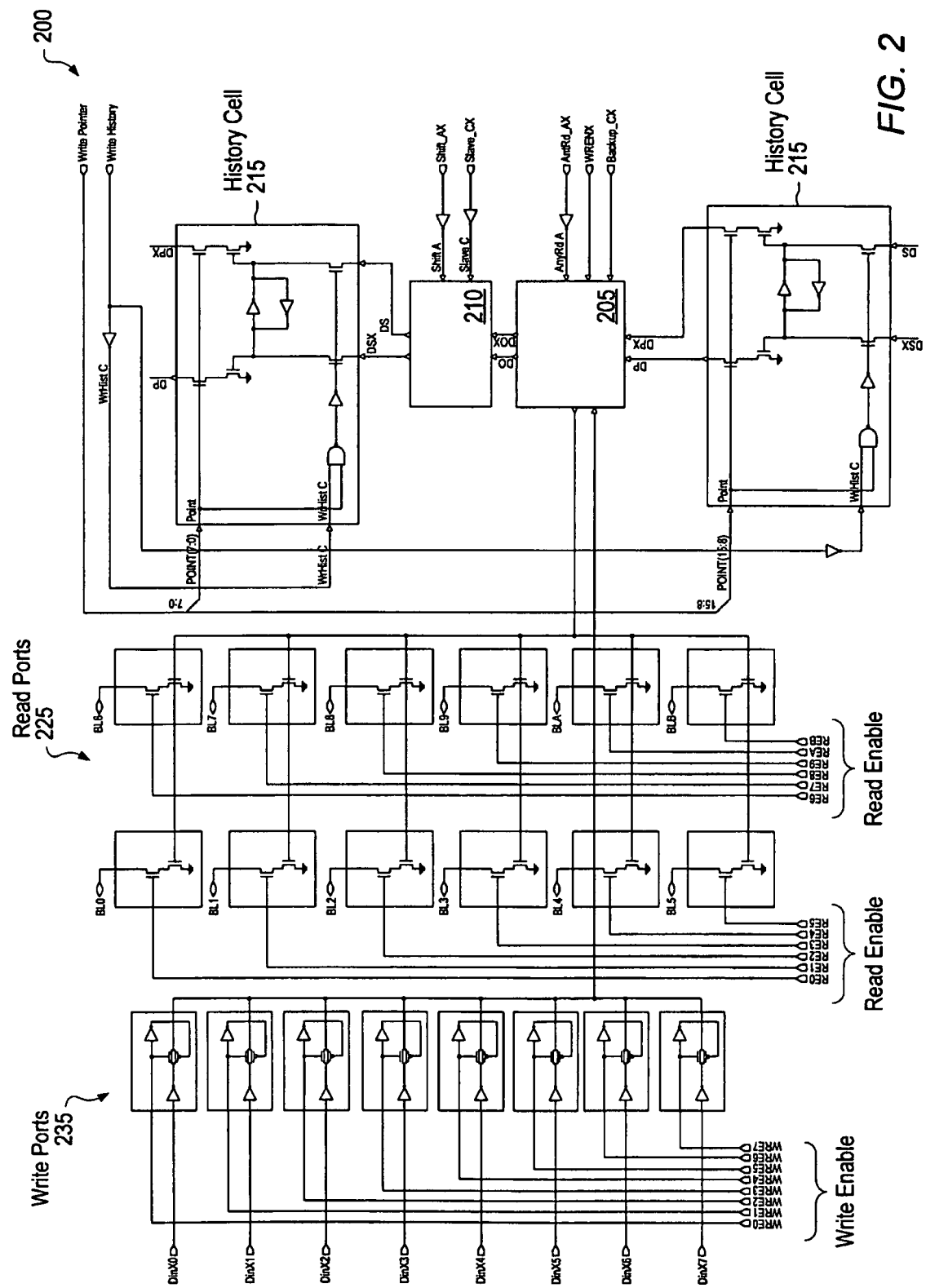
FIG. 2 is a schematic diagram of one embodiment of a multi-ported register cell.

FIG. 2 is a schematic diagram of one embodiment of a multi-ported register cell. Multi-ported register cell 200 (hereinafter 'register cell 200') is one of a plurality of register cells that can be used to form a complete register (including a complete base register, a complete shift register, and a complete set of history registers) which is used as one of the registers in register file 100 above. The particular embodiment shown is configured to include 16 history cells. For the sake of simplicity, only two of the history cells are shown in this example. Additionally, one of the history cells is shown as being coupled to write directly to the base cell, while the other cell is shown as being coupled to receive data from the base cell via the history cell. However, it is to be understood that each of the history cells are couple both to write data directly to the base cell (as shown by the lower history cell 215) and coupled to receive data from the base cell via a shift cell (as shown by the upper history cell 215).

Register cell 200 includes a base cell 205, a shift cell 210, a plurality of history cells 215, a plurality of read ports 225 and a plurality of write ports 235. Base cell 205 is the primary storage cell, and stores one bit of an active register state of the register file in which register cell 200 is to be implemented. Similarly, each of the history cells 215 is configured to store one bit of a previously active register state. Each of the history cells 215 is coupled to the base cell 205 through different ports. A first port of each history cell 215 is coupled to write directly into base cell 205, via the signal paths labeled DP and DPX. A second port of each history cell 215 is coupled to receive data from the base cell 205 via shift cell 210 and the signal paths labeled DS and DSX. Shift cell 210, which, in this embodiment, implements a 2-stage pipeline between base cell 205 and each of the history cells 215, is coupled to receive data from base cell 205 via the signal paths labeled D0 and D0X. Base cell is also coupled to each of twelve different read ports 225 and eight different write ports 235 in this particular embodiment.

A write operation to the base cell from an external source may be effected by providing write enable signals to both the base cell 205 and one of the write ports 235. The base cell 205 is coupled to receive a write enable signal WRENX from an external source, while a selected one of the write ports is coupled to receive a write enable signal from an external source (one of WREN0_WREN7). Data propagated to the selected write port 235 via one of the data lines DinX0-DinX7 is then allowed to propagate to base cell 205 via the signal line labeled DW.

A read operation to base cell 205 initiated by an external source may be effected by providing a read enable signal to a selected read port (one of RE0-REB). When the read enable signal is asserted, data stored in base cell 205 is allowed to propagate to the selected read port 225 via the signal line DR, through the selected read port 225, and to an external target via the associated bitline (one of bitlines BL0 to BLB).

Writing to one of the history cells 215 from base cell 205 is accomplished by first enabling one of two shift enable signals that shift cell 210 is coupled to receive in this embodiment and a read enable signal conveyed to base cell 205 (AnyRd_A). When the AnyRD_A signal is received by base cell 205, the data stored therein is allowed to propagate to shift cell 201 via the signal paths labeled D0 and D0X. Data is latched into shift cell 210 upon its receiving a first shift enable signal, Slave_C, thus allowing data to be temporarily stored in the first stage of a 2-stage pipeline. Subsequent to receiving the Slave_C signal, data may be latched to a second stage of the two stage pipeline when a second shift enable signal, Shift_A is received by shift cell 210. After shifting data to the second stage of the 2-stage pipeline implemented by shift cell 210, a selected one of the history cells 215 may receive the data. This selected history cell 215 is enabled for receiving the data by receiving both a pointer signal from one of the pointer signal lines Point [15:0] and a write history enable signal, WrHist_C. Data is propagated from the second stage of shift cell 210 to the selected history cell 215 responsive to the history cell receiving both of these signals. In using the 2-stage pipeline for writing data from the base cell 205 to one of history cells 215, the write operation requires at least two cycles. However, by implementing the 2-stage pipeline, register cell 200 effectively stores two extra states of history in addition to the sixteen states stored by the history cells 215.

Base cell 205 is enabled to recover history by restoring one of its previously stored states responsive to receiving a backup enable signal, Backup_CX. A selected history cell 215 may be configured to write to base cell 205 via signal lines DP and DPX when it receives a pointer signal from one of the pointer signal lines. When the selected history cell 215 has received the pointer signal and base cell 205 has received the backup signal, data may then propagate to base cell 205 via the coupled signal lines. This restore operation may take place in as little as a single cycle, allowing fast recovery of a previously stored register state.

Figure 3:
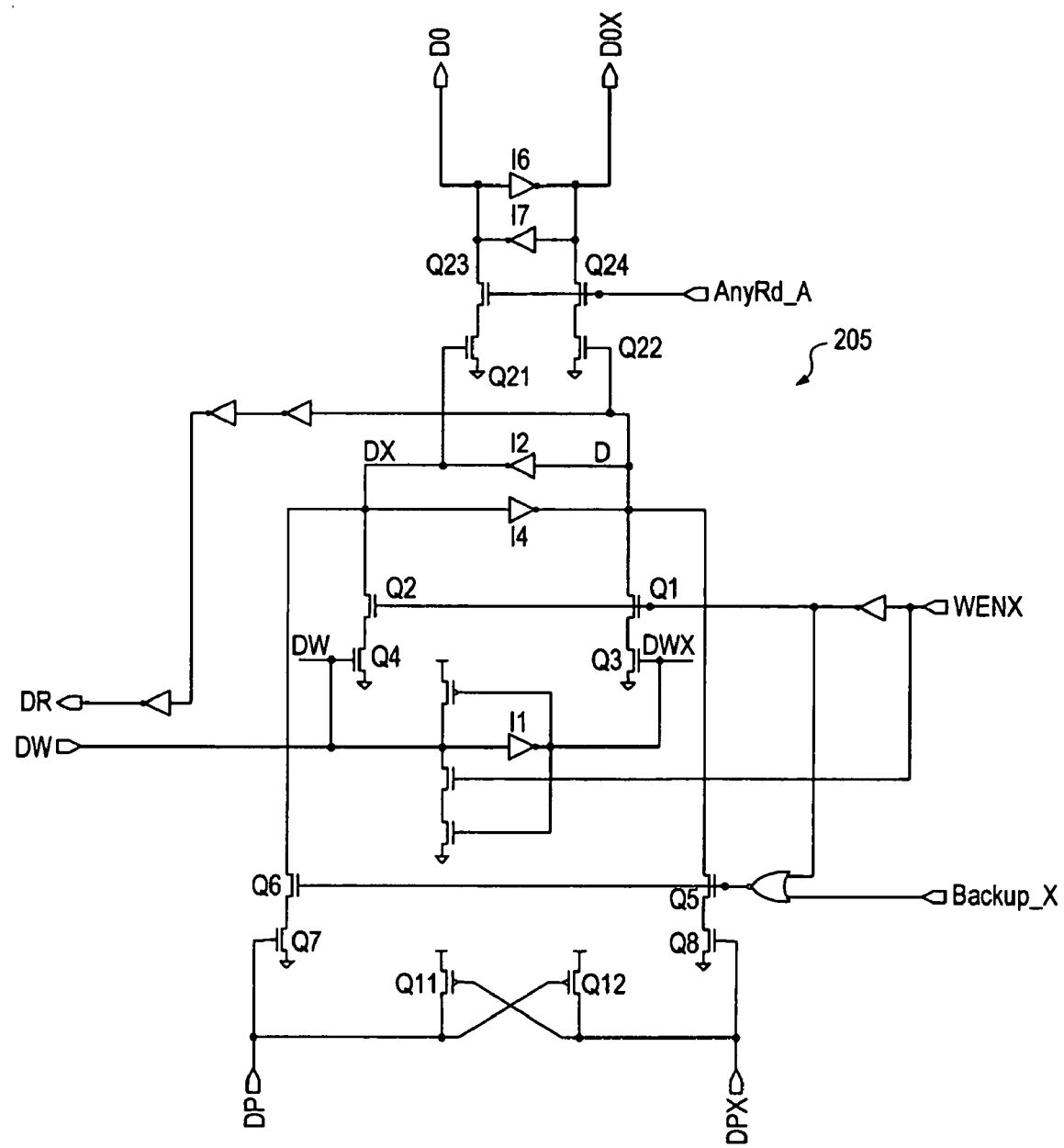
FIG. 3 is a schematic diagram of one embodiment of a base cell circuit used in the multi-ported register cell.

FIG. 3 is a schematic diagram of one embodiment of a base cell circuit used in the multi-ported register cell. In the embodiment shown, base cell 205 is coupled to receive data from a write port via signal path DW, from a history cell via signal paths DP and DPX. Base cell is further configured to allow data to be conveyed to a read port through signal path DR and to a history cell (via a shift cell in the embodiments discussed above) via signal paths D0 and D0X.

In this particular embodiment, base cell 205 does not require a read enable signal in order for its stored data to be read by an external unit. In this embodiment, enabling reads of base cell 205 is performed by enabling one of the coupled read ports. Conversely, base cell 205 is coupled to receive multiple write enable signals in order to allow writes from the various circuits coupled thereto. If the write to base cell 205 is from one of the write ports, only the write enable signal on signal path WRENX need be asserted. When a signal is asserted (in this case, as a logic low voltage) on this signal path, transistors Q1 and Q2 are turned on by virtue inverter I2 inverting the signal. Data present on signal line DW is then written into the storage cell comprising I2 and I4 by activating one of transistors Q3 and Q4 (the other one of these two transistors remains inactive by virtue of inverter I1). The activated one of transistors Q3 and Q4 (when WRENX is also asserted) will cause the data on node DX or D to be pulled down, and thus causing the other side to be pulled up, thereby storing the data.

When data is to be written from one of the history cells into base cell 205, a backup enable signal (Backup_X) is required order to complete the operation. Logic gate G1 is configured to combine the Backup_X and WRENX signal in order to provide an output signal that turns on transistors Q5 and Q6. In this particular embodiment, gate G1 is a NOR gate, and is configured to assert a logic high output when both the WRENX and Backup_X signals in logic low voltages. The logic high signal turns on transistors Q5 and Q6, while one of transistors Q7 or Q8 will be turned on by virtue of a logic high signal on one of either of their respective signal paths, signal path DP or signal path DPX. The logic high on either signal path DP or DPX is produced by driving a logic low to the other one of these two signal paths. The logic low will turn on one of transistors Q11 or Q12, whose gate terminals are each coupled to one of the signal paths. When one of these transistors is turned on, the signal path opposite the one coupled to the gate terminal is pulled up through the channel of the activated transistor. When the one signal path has been pulled high, it then causes one of Q5 or Q6 to be turned on, thus pulling low one of nodes D or DX, and thus data from the selected history cell is written into base cell 205.

Data can be written to one of to a history cell (via the shift cell in the embodiments discussed above) by activating the AnyRd_A signal. This signal, when in a logic high state, causes both of transistors Q23 and Q24 to be turned on. One of transistors Q21 and Q22 will be in an on state as a result of the voltage level on signal nodes DX and D, respectively. Thus, if the pair of transistors including Q21 and Q23 are both turned on, the voltage on signal line D0 is pulled low, while the voltage on D0 becomes a logic high. If the pair of transistors including Q22 and Q24 are both turned on, the voltage on signal line D0X is pulled down, while the voltage on D0 becomes a logic high. The process of producing complementary signals on D0 and D0X is aided by the presence of inverters I6 and I7, which also allow the respective states to be held on these signal lines after the AnyRd_A signal becomes low again. These signals, coupled to another cell circuit, represent the history data that is to be written from base cell 205 to a history cell.

Figure 4:
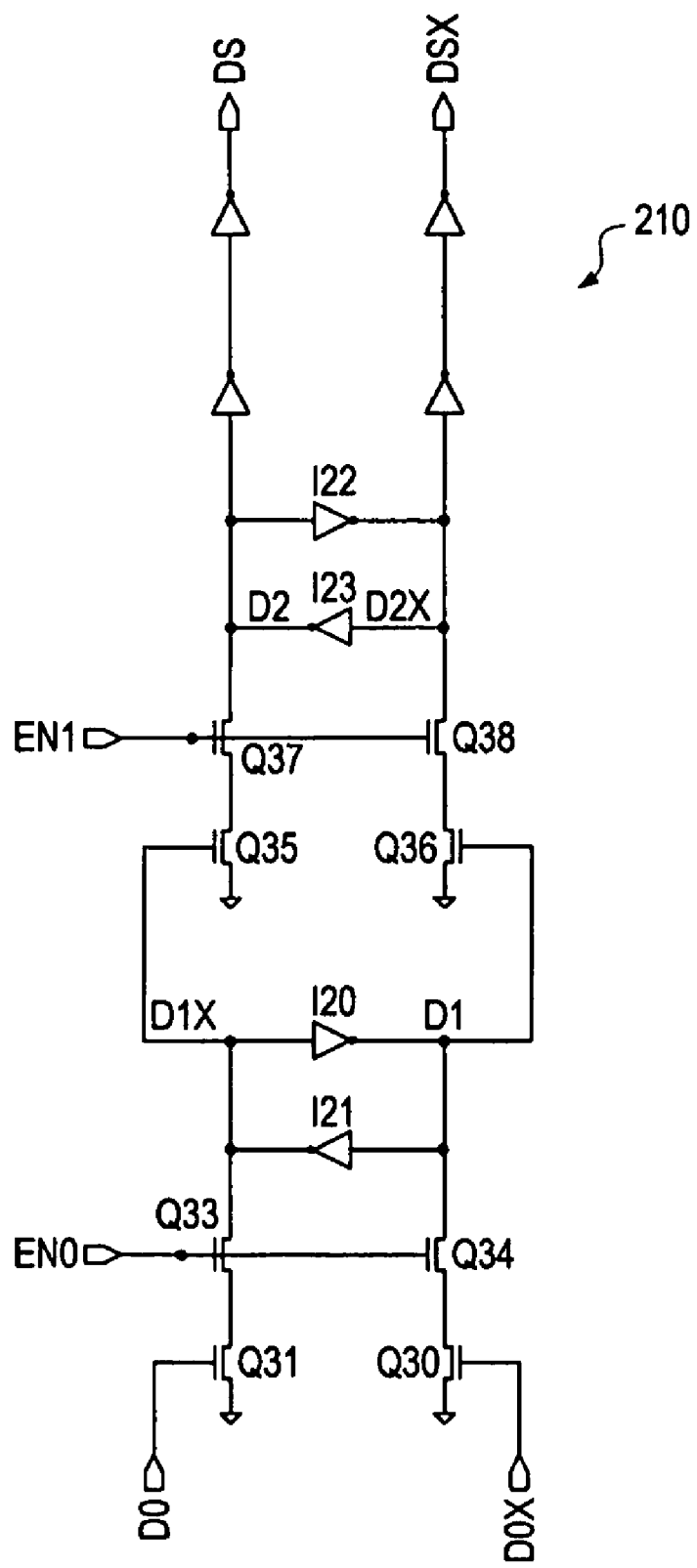
FIG. 4 is a schematic diagram of one embodiment of a shifter cell circuit used in the multi-ported register cell.

FIG. 4 is a schematic diagram of one embodiment of a shifter cell circuit used in the multi-ported register cell. Shift cell 210, as discussed above, is coupled in the write path between a base cell and a plurality of history cells, and thus forms a pipeline between the base cell and the history cells. Shift cell 210 is coupled to receive data from a base cell via signal paths D0 and D0X. One of these signal paths will carry a logic high voltage, thereby turning on one of transistors Q30 or Q31. When the enable signal EN0 (equivalent to the Slave_C signal discussed above), transistors Q33 and Q34. When this occurs, one of signal nodes D1 and D1X is turned on, depending upon which of transistors Q30 and Q31. Thus, asserting the EN0 signal latches data from the D0 and D0X signal paths to the D1 and D1X signal nodes, respectively. Inverters I20 and I21 help maintain the values stored on nodes D1 and D1X. Data is latched to the next stage of the pipeline in a similar manner when the enable signal EN1 (equivalent to the enable signal Shift_A discussed above) is asserted. After data has been latched to this stage of the pipeline implemented by shift cell 210, it is ready for being received by a selected history cell in accordance with the manner in which the history cell operates.

It is noted that various specifications of the register cells and register file discussed herein are for exemplary purposes only. For example, while the register cell discussed herein includes sixteen history cells and a two-stage pipeline for writing from the base cell to the history cells, embodiments having a greater or lesser number of history cells and a greater or lesser number of pipeline stages are possible and contemplated. Similarly, embodiments having greater or lesser numbers of read and write ports are also possible and contemplated. Broadly speaking, the register file and register cells discussed herein can be generalized to virtually any size necessary for a particular implementation. Furthermore, the particular signal combinations necessary for enabling the various cells may also be different than shown here while still remaining within the scope of the circuits discussed herein.

Thus, while the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A register cell comprising:
   a base cell; and
   a plurality of history cells each coupled to the base cell;
   wherein each of the plurality history cells is coupled to write to the base cell through a first port, and wherein each of the plurality of history cells is coupled to receive data from the base cell through a second port; and
   wherein the register cell further includes a shift cell, wherein the shift cell is coupled between the base cell and the history cell, wherein the base cell is coupled to write to each of the plurality of history cells through the shift cell, and wherein each of the plurality of history cells is coupled to write directly to the base cell.

2. The register cell as recited in claim 1, wherein the shift cell is configured to delay a write from the base cell to one of the plurality of history cells, wherein the shift cell forms a pipeline between the base cell and the plurality of history cells.

3. The register cell as recited in claim 2, wherein the shift cell is configured to delay the write from the base cell to the one of the plurality of history cells by two cycles.

4. The register cell as recited in claim 3, wherein the plurality of history cells includes 16 history cells, and wherein the history space of the register cell, including the shift cell, is 18 bits.

5. The register cell as recited in claim 1, wherein the register cell further includes a plurality of write ports coupled to the base cell, wherein each of the plurality of write ports is configured to perform an external write to the base cell.

6. The register cell as recited in claim 1, wherein the register cell further includes a plurality of read ports coupled to the base cell, wherein each of the plurality of read ports is configured to perform an external read from the base cell.

7. The register cell as recited in claim 1, wherein each of the plurality of history cells are configured to write to the base cell in a single cycle.

8. The register cell as recited in claim 1, wherein the base cell is configured to write to one of the history cells in a single cycle.

9. The register cell as recited in claim 8, wherein each of the plurality of history cells is configured to receive a pointer signal and to write to the base cell responsive to receiving the pointer signal.

10. The register cell as recited in claim 1, wherein the base cell is coupled to receive a data input and a complementary data input from each of the plurality of history cells, and wherein each of the plurality of history cells is configured to drive only one of the data input and the complementary data input.

11. A register file comprising;
a plurality of register cells, wherein each of the register cells includes:
a base cell; and
a plurality of history cells coupled to the base cell;
wherein each of the plurality history cells is coupled to write to the base cell through a first port, and wherein each of the plurality of history cells is coupled to receive data from the base cell through a second port;
wherein each of the plurality of register cells further includes a shift cell, wherein the shift cell is coupled between the base cell and the history cell, wherein the base cell is configured to write to each of the plurality of history cells through the shift cell, and wherein each of the plurality of history cells is coupled to write directly to the base cell.

12. The register file as recited in claim 11, wherein the shift cell is configured to delay a write from the base cell to one of the plurality of history cells wherein the shift cell forms a pipeline between the base cell and the plurality of history cells.

13. The register file as recited in claim 12, wherein the shift cell is configured to delay the write from the base cell to the one of the plurality of history cells by two cycles.

14. The register file as recited in claim 13, wherein the plurality of history cells includes 16 history cells, and wherein the history space of the register cell, including the shift cell, is 18 bits.

15. The register file as recited in claim 11, wherein the register cell further includes a plurality of write ports coupled to the base cell, wherein each of the plurality of write ports is configured to perform an external write to the base cell.

16. The register file as recited in claim 11, wherein the register cell further includes a plurality of read ports coupled to the base cell, wherein each of the plurality of read ports is configured to perform an external read from the base cell.

17. The register file as recited in claim 11, wherein each of the plurality of history cells are configured to write to the base cell in a single cycle.

18. The register file as recited in claim 11, wherein the base cell is configured to write to one of the history cells in a single cycle.

19. The register file as recited in claim 18, wherein each of the plurality of history cells is configured to receive a pointer signal and to write to the base cell responsive to receiving the pointer signal.

20. The register file as recited in claim 11, wherein the base cell is coupled to receive a data input and a complementary data input from each of the plurality of history cells, and wherein each of the plurality of history cells is configured to drive only one of the data input and the complementary data input.

21. A register cell comprising:
a base cell; and
a plurality of history cells each coupled to the base cell;
wherein each of the plurality history cells is coupled to write to the base cell through a first port, and wherein each of the plurality of history cells is coupled to receive data from the base cell through a second port;
wherein the base cell is configured to write to one of the history cells in a single cycle; and
wherein each of the plurality of history cells is configured to receive a pointer signal and to write to the base cell responsive to receiving the pointer signal.

22. A register cell comprising:
a base cell; and
a plurality of history cells each coupled to the base cell;
wherein each of the plurality history cells is coupled to write to the base cell through a first port, and wherein each of the plurality of history cells is coupled to receive data from the base cell through a second port; and
wherein the base cell is coupled to receive a data input and a complementary data input from each of the plurality of history cells, and wherein each of the plurality of history cells is configured to drive only one of the data input and the complementary data input.

23. A register file comprising;
a plurality of register cells, wherein each of the register cells includes:
a base cell; and
a plurality of history cells coupled to the base cell;
wherein each of the plurality history cells is coupled to write to the base cell through a first port, and wherein each of the plurality of history cells is coupled to receive data from the base cell through a second port;
wherein the base cell is configured to write to one of the history cells in a single cycle; and
wherein each of the plurality of history cells is configured to receive a pointer signal and to write to the base cell responsive to receiving the pointer signal.

24. A register file comprising;
a plurality of register cells, wherein each of the register cells includes:
a base cell; and
a plurality of history cells coupled to the base cell;
wherein each of the plurality history cells is coupled to write to the base cell through a first port, and wherein each of the plurality of history cells is coupled to receive data from the base cell through a second port;
wherein the base cell is coupled to receive a data input and a complementary data input from each of the plurality of history cells, and wherein each of the plurality of history cells is configured to drive only one of the data input and the complementary data input.

* * * * *